United States Patent [19]

Okui et al.

[11] Patent Number: 4,771,265

[45] Date of Patent: Sep. 13, 1988

[54] DOUBLE INTEGRATION ANALOG TO DIGITAL CONVERTING DEVICE

[75] Inventors: Yoshihiro Okui, Daito; Seiiku Ito, Amagasaki, both of Japan

[73] Assignee: Minolta Camera Kabushiki Kaisha, Osaka, Japan

[21] Appl. No.: 48,591

[22] Filed: May 11, 1987

[30] Foreign Application Priority Data

May 12, 1986 [JP] Japan ................................ 61-108288

[51] Int. Cl.[4] ............................................ H03M 1/52
[52] U.S. Cl. ................................ 341/167; 324/99 D
[58] Field of Search ................ 340/347 NT, 347 AD, 340/347 CC, 347 C, 347 M; 324/99 D

[56] References Cited

U.S. PATENT DOCUMENTS 3,710,374 1/1973 Kelly ............................. 340/347 NT Primary Examiner—T. J. Sloyan Attorney, Agent, or Firm—Burns, Doane, Swecker & Mathis

[57] ABSTRACT

An analog to digital converting device which can convert analog input signals individually into digital values of accurately corresponding magnitudes even when there is some difference in the input signals. The device comprises an integrating circuit which includes an operational amplifier for receiving an analog signal, an integrating capacitor connected between an input terminal and an output terminal of the operational amplifier, and a reset switch connected in parallel to the integrating capacitor. The integrating circuit is controlled to first perform an integrating operation and then an inverse integrating operation. A comparator is connected to an output terminal of the integrating circuit. A diode or transistor is connected in parallel to the integrating capacitor for limiting an amount of charge to be accumulated in the integrating capacitor by an inverse integrating operation to below a predetermined value.

6 Claims, 8 Drawing Sheets

DOUBLE INTEGRATION ANALOG TO DIGITAL CONVERTING DEVICE

BACKGROUND OF THE INVENTION

1. Field of the Invention

This invention relates to an analog to digital converting device, and more particularly to an analog to digital converting device of the type which includes a double integration analog to digital converter.

2. Description of the Prior Art

A conventional analog to digital converting device of the type mentioned includes in most cases a plurality of double integration analog to digital converters each of which includes an integrating circuit consisting of an operational amplifier, an integrating capacitor connected between input and output terminals of the operational amplifier, and a reset switch connected in parallel to the integrating capacitor, a comparator connected to an output terminal of the integrating circuit, an integration switch for supplying a signal to the integrating circuit to start an integrating operation of the integrating circuit, and an inverse integration switch for causing the integrating circuit to start an inverse integrating operation. A controller of the analog to digital converting device controls the reset switch, the integration switch and the inverse integration switch to operate in this order.

An example of the analog to digital converting devices of the type mentioned is illustrated in FIG. 1. Referring to FIG. 1, the analog to digital converting device shown includes a pair of double integration analog to digital converters $AD_1$, $AD_2$. Each of the double integration analog to digital converters $AD_1$, $AD_2$ includes an integrating circuit $INT_1$, $INT_2$, a comparator $COM_1$, $COM_2$ having a non-inverting input terminal (+) connected to an output terminal of the integrating circuit $INT_1$, $INT_2$, an integration switch $IS_1$, $IS_2$ for delivering an input signal $V_1$, $V_2$ to the integrating circuit $INT_1$, $INT_2$ to cause the latter to start an integrating operation, an inverse integration switch $AIS_1$, $AIS_2$ for causing the integrating circuit $INT_1$, $INT_2$ to start an inverse integrating operation, and a constant-current circuit $CI_1$, $CI_2$ connected to the inverse integration switch $AIS_1$, $AIS_2$, respectively. A resistor $R_1$, $R_2$ is connected to the integration switch $IS_1$, $IS_2$, respectively.

Each of the integrating circuits $INT_1$, $INT_2$ includes an operational amplifier $OP_1$, $OP_2$, an integrating capacitor $C_1$, $C_2$ connected between an inverting input terminal (−) and an output terminal of the operational amplifier $OP_1$, $OP_2$, and a reset switch $RS_1$, $RS_2$ connected in parallel to the integrating capacitor $C_1$, $C_2$, respectively.

The characteristics of the two double integration analog to digital converters $AD_1$, $AD_2$ having the construction described above are similar to each other.

The device shown in FIG. 1 further includes a controller CONT for controlling the reset switches $RS_1$, $RS_2$, the integration switches $IS_1$, $IS_2$ and the inverse integration switches $AIS_1$, $AIS_2$ to turn on in this order.

Counters $COUN_1$, $COUN_2$ are connected to output terminals of the double integration analog to digital converters $AD_1$, $AD_2$, respectively, and a clock generator TM is connected to deliver reference clock signals to the controller CONT and the counters $COUN_1$, $COUN_2$.

The controller CONT executes following operations in a sequential cyclical manner:

(1) to deliver a reset signal $Q_3$ to the reset switches $RS_1$, $RS_2$ at a time just when analog to digital conversion is completed on both of the double integration analog to digital converters $AD_1$, $AD_2$;

(2) after lapse of a predetermined interval of time after starting of delivery of the reset signal $Q_3$, to stop delivery of the reset signal $Q_3$ and deliver an integrating signal $Q_1$ simultaneously to both of the integration switches $IS_1$, $IS_2$;

(3) after the lapse of another predetermined interval of time after starting of delivery of the integrating signal $Q_1$, to stop delivery of the integrating signal $Q_1$, deliver an inverse integrating signal $Q_2$ simultaneously to both of the inverse integration switches $AIS_1$, $AIS_2$ and deliver a counting start signal simultaneously to both of the counters $COUN_1$, $COUN_2$; and (4) at a time just when analog to digital conversion is completed on the double integration analog to digital converter $AD_1$, to deliver a latch signal to the counter $COUN_1$, and then at a time just when analog to digital conversion is completed on the double integration analog to digital converter $AD_2$, to deliver a latch signal to the counter $COUN_2$.

Now, operation of the analog to digital converting device will be described.

(I) When the input signals $V_1$, $V_2$ are equal to each other:

Referring to FIG. 2, when the controller CONT stops, at a time $t_1$, delivery of a reset signal $Q_3$ to both of the double integration analog to digital converters $AD_1$, $AD_2$ and delivers an integrating signal $Q_1$, the integration switches $IS_1$, $IS_2$ are turned on so that input signals $V_1$, $V_2$ are delivered to the integrating circuits $INT_1$, $INT_2$ via the resistors $R_1$, $R_2$, respectively. Consequently, charging of the integrating capacitors $C_1$, $C_2$ in the negative polarity is started, and accordingly the outputs $V_{INT1}$, $V_{INT2}$ of the integrating circuits $INT_1$, $INT_2$ thereafter decrease linearly. Since the outputs $V_{INT1}$, $V_{INT2}$ are lower than 0 volts, outputs of the comparators $COM_1$, $COM_2$ both present an "L" (low) level.

Then at a time $t_2$, the delivery of the integrating signal $Q_1$ is stopped and an inverse integrating signal $Q_2$ is delivered while at the same time a counting start signal is delivered. In response to the inverse integrating signal $Q_2$, the inverse integration switches $AIS_1$, $AIS_2$ are turned on so that the charge accumulated in the integrating capacitors $C_1$, $C_2$ is discharged therefrom via the constant-current circuits $CI_1$, $CI_2$. In particular, as an inverse integrating operation, charge of the positive polarity is accumulated in the integrating capacitors $C_1$, $C_2$ so that the outputs $V_{INT1}$, $V_{INT2}$ of the integrating circuits $INT_1$, $INT_2$ increase linearly. However, since the outputs $V_{INT1}$, $V_{INT2}$ still remain lower than 0 volts, the outputs of the comparators $COM_1$, $COM_2$ maintain the "L" level thereof.

Meanwhile, in response to the counting start signal, the counters $COUN_1$, $COUN_2$ start counting of clock signals from the clock generator TM. The counting operation is performed only during a limited period of time while the outputs of the comparators $COM_1$, $COM_2$ maintain the "L" level.

As a result of the inverse integrating operation, the outputs $V_{INT1}$, $V_{INT2}$ of the integrating circuits $INT_1$, $INT_2$ finally reach a voltage of 0 volts particularly at the same point of time. Thus, at the time $t_3$ when the outputs $V_{INT1}$, $V_{INT2}$ of the integrating circuits $INT_1$, $INT_2$ reach 0 volts, the outputs of the comparators $COM_1$, $COM_2$ are received and now present an "H" (high) level. The outputs of the comparators $COM_1$, $COM_2$ of the "H" level are delivered as latch signals to the counters $COUN_1$, $COUN_2$, respectively. At the same time, the delivery of the inverse integrating signal $Q_2$ is stopped and a reset signal $Q_3$ is delivered from the controller CONT to the reset switches $RS_1$, $RS_2$.

Thus, the reset switches $RS_1$, $RS_2$ are turned on in response to the reset signal $Q_3$ so that the charge accumulated in the integrating capacitors $C_1$, $C_2$ is discharged at a moment. Consequently, the outputs $V_{INT1}$, $V_{INT2}$ of the integrating circuits $INT_1$, $INT_2$ are reduced and thereafter maintained to 0 volts. Meanwhile, in response to the latch signal, the counters $COUN_1$, $COUN_2$ latch their respective values then which indicate numbers of clock pulses and hence an interval of time from the time $t_2$ to the time $t_3$.

Then at a time $t_4$ after lapse of a predetermined interval of time after the time $t_3$, an integrating operation, that is, charging of the integrating capacitors $C_1$, $C_2$, is resumed.

(II) When the input signals $V_1$, $V_2$ are different from each other:

Operation when an input signal $V_2$ is smaller than another input signal $V_1$ will be described, for example, with reference to a time chart of FIG. 3.

At a time $t_{11}$ at which an integrating signal $Q_1$ is developed, charging of the integrating capacitors $C_1$, $C_2$ in the negative polarity is started, and consequently the outputs $V_{INT1}$, $V_{INT2}$ of the integrating circuits $INT_1$, $INT_2$ thereafter decrease. However, since the input signal $V_2$ is smaller than the other input signal $V_1$, the decreasing ratio of the output $V_{INT2}$ is lower than the decreasing ratio of the output $V_{INT1}$. Accordingly, at a time $t_{12}$ when an inverse integrating signal $Q_2$ is produced, the decreased amount of the output $V_{INT2}$ from 0 volts is smaller than that of the output $V_{INT1}$.

To the contrary, in an inverse integrating operation, the increasing ratio of the output $V_{INT2}$ is equal to that of the output $V_{INT1}$ because discharging of the charge accumulated in the integrating capacitors $C_1$, $C_2$ is performed both with the same constant current $i_r$ via the constant-current circuits $CI_1$, $CI_2$, respectively. Accordingly, the output $V_{INT2}$ reaches 0 volts in advance of the other output $V_{INT1}$ by an interval of time $t_a$ in FIG. 3. In particular, the output $V_{INT2}$ reaches 0 volts at a time $t_{13}$, and then at a time $t_{15}$, the output $V_{INT1}$ at last reaches 0 volts.

However, where input signals $V_1$, $V_2$ are different from each other, the conventional analog to digital converting device described above presents following problems.

In particular, a reset signal $Q_3$ is produced just when the outputs $V_{INT1}$, $V_{INT2}$ of both of the integrating circuits $INT_1$, $INT_2$ reach 0 volts. Accordingly, a reset signal $Q_3$ is not produced until after the time $t_{15}$ while output of an inverse integrating signal $Q_2$ continues till then.

Accordingly, there is no problem with the integrating circuit $INT_1$, but in the case of the integrating circuit $INT_2$, the inverse integrating operation continues even after the output $V_{INT2}$ thereof has reached 0 volts. Accordingly, charging of the integration capacitor $C_2$ in the positive polarity is continued so that, at the time $t_{15}$ at which a reset signal $Q_3$ is developed, a considerable amount of charge of the positive polarity is accumulated in the integrating capacitor $C_2$. Accordingly, at a time $t_{16}$ at which the delivery of the reset signal $Q_3$ is stopped, some percent of the charge accumulated in the integrating capacitor $C_2$ just before production of the reset signal $Q_3$ will be restored in the integrating capacitor $C_2$ due to dielectric absorption of the same.

Consequently, even at the time $t_{16}$ at which the production of the reset signal $Q_3$ is stopped and the integrating signal $Q_1$ is produced, the output $V_{INT2}$ of the integrating circuit $INT_2$ is not equal to 0 volts but has a positive value $\alpha$. As a result, the time at which the output of the comparator $COM_1$ is changed over to the "L" level is $t_{16}$ whereas the time at which the output of the comparator $COM_2$ is changed over to the "L" level is $t_{17}$, yielding a difference $t_b$ in time between them.

The difference in time will cause an error in the period of time over which the comparator $COM_2$ is to continue to deliver its output in a subsequent next cycle of analog to digital conversion and finally cause an error in the count value of the counter $COUN_2$. In particular, the output $V_{INT2}$ of the integrating circuit $INT_2$ must by nature present such a change as indicated by a chain line in FIG. 3. In such a case, the time $t_{14}$ at which the output $V_{INT2}$ reaches 0 volts is delayed by the time $t_b$ from the time $t_{13}$ as provided by the solid line. More precisely, despite that the counter $COUN_2$ must continue its counting operation even during the period of time $t_b$, actually the counting operation comes to an end at the time $t_{13}$.

In other words, the counter $COUN_1$ presents a count value as counted from the time $t_{12}$ to the time $t_{15}$ while the output of the comparator $COM_1$ maintains the "L" level, and thus corresponds to the input signal $V_1$. To the contrary, the counter $COUN_2$ presents a count value as counted from the time $t_{12}$ to the time $t_{13}$ while the output of the comparator $COM_2$ maintains the "L" level. Accordingly, the count value of the counter $COUN_2$ is smaller than a correct count value as counted naturally from the time $t_{12}$ to the time $t_{14}$ and does not, therefore, correspond to the input signal $V_2$.

Such an error will increase as the difference between the input signals $V_1$ and $V_2$ increases.

Various countermeasures have been proposed to resolve the problem. They are, for example, (1) to employ an integrating capacitor which has a low dielectric absorption characteristic such as a mica capacitor;

(2) to elongate the resetting time for an integrating capacitor; or (3) to connect a latch circuit to an output terminal of a comparator to adjust a time at which an inverse integrating signal $Q_2$ is to be developed.

However, the countermeasure as listed (1) above has a drawback that the overall capacity of the capacitor may be too great or else the capacitor may not have a sufficient capacity. Meanwhile, the countermeasure (2) has another drawback that too much time is required for analog to digital conversion and accordingly the efficiency is low. Now, the countermeasure (3) will be described with reference to FIGS. 4 and 5 in which an exemplary one of such countermeasures is illustrated.

A latch circuit LA is connected to an output terminal of a comparator COM of a double integration analog to digital converting circuit AD and delivers a signal of an "H" level to an AND gate $AND_1$ when the output of the comparator COM is at an "L" level. During an inverse integrating operation, an inverse integrating signal $Q_2$ which is directly delivered from a controller CONT presents the "H" level, and accordingly a final inverse integrating signal Q$_2$' to an inverse integrating switch AIS also maintains the "H" level so that the inverse integrating operation is continued.

However, if the output V$_{INT}$ of an integrating circuit INT reaches 0 volts and consequently the controller CONT detects a change-over of the output of the comparator COM from the "L" to the "H" level and delivers a latch signal to the latch circuit LA, the latch circuit LA now delivers a signal of the "L" level to the AND gate AND$_1$. Consequently, the final inverse integrating signal Q$_2$' to the inverse integration switch AIS is changed over to the "L" level so that the inverse integration switch AIS is turned off thereby to stop the inverse integrating operation. Accordingly, the output V$_{INT}$ of the integrating circuit INT will thereafter maintain 0 volts and will never present a voltage higher than 0 volts. Thus, excessive charging of an integrating capacitor C in the integrating circuit INT which is connected to receive a smaller input signal is prevented and no dielectric absorption appears. Accordingly, appearance of an error in the count value of a counter is prevented.

In this instance, however, in case a latch signal is produced in response to a noise N as indicated by a broken line in FIG. 5 during an inverse integrating operation, a count value then will be latched and the final inverse integrating signal Q$_2$' will be changed into the "L" level to stop the inverse integrating operation before a point of time at which the final inverse integrating signal Q$_2$' is naturally to be changed into the "L" level. Consequently, before the output V$_{INT}$ of the integrating circuit INT reaches 0 volt, it stops its increase so that the output of the comparator COM will thereafter continue its "L" level condition. Accordingly, it is a problem that a counter may present an extraordinarily small wrong count value.

SUMMARY OF THE INVENTION

It is an object of the present invention to provide an analog to digital converting device which can convert input signals of analog values to a plurality of double integration analog to digital converters thereof individually into digital values of accurately corresponding magnitudes even when there is some difference in the input signals.

In order to attain the object, in accordance with the present invention, there is provided an analog to digital converting device, comprising integrating means including an operational amplifier connected to receive an analog signal which is to be converted into a digital signal, an integrating capacitor connected between an input terminal and an output terminal of said operational amplifier, and a reset switch connected in parallel to said integrating capacitor, a comparator connected to an output terminal of said integrating means, integration starting means for starting an integrating operation of said integrating means, inverse integration starting means for starting an inverse integrating operation of said integrating means, controlling means for activating said reset switch of said integrating means, said integration starting means and said inverse integration starting means in this order, and limiting means connected in parallel to said integrating capacitor for limiting an amount of charge to be accumulated in said integrating capacitor by an inverse integrating operation to below a predetermined value.

In the analog to digital converting device of the invention, if the integrating means attempts to continue its inverse integrating operation after completion of its analog to digital converting operation, when charge accumulated in the integrating capacitor of the integrating means by such continued inverse integrating operation reaches a critical level, the limiting means operates to stop further charging of the integrating capacitor. Consequently, the amount of charge accumulated in the integrating capacitor by the inverse integrating operation after completion of analog to digital conversion is limited to below a predetermined level.

Consequently, when the reset switch of the integrating means is subsequently operated, no dielectric absorption will occur in the integrating capacitor and accordingly no charge will remain therein. Accordingly, the integrating capacitor can be restored to its completely discharged initial condition.

The above and other objects, features and advantages of the present invention will become apparent from the following description and the appended claims, taken in conjunction with the accompanying drawings.

DETAILED DESCRIPTION OF THE PREFERRED EMBODIMENTS

A first embodiment of the invention will first be described in detail with reference to FIGS. 6 and 7. In those figures, like parts or like signal wave forms may be denoted by like reference symbols to those of FIGS. 1 to 3. Further, unless otherwise specified, connections of parts in the arrangement of FIG. 6 are similar to those in the conventional arrangement of FIG. 1.

Figure 6:
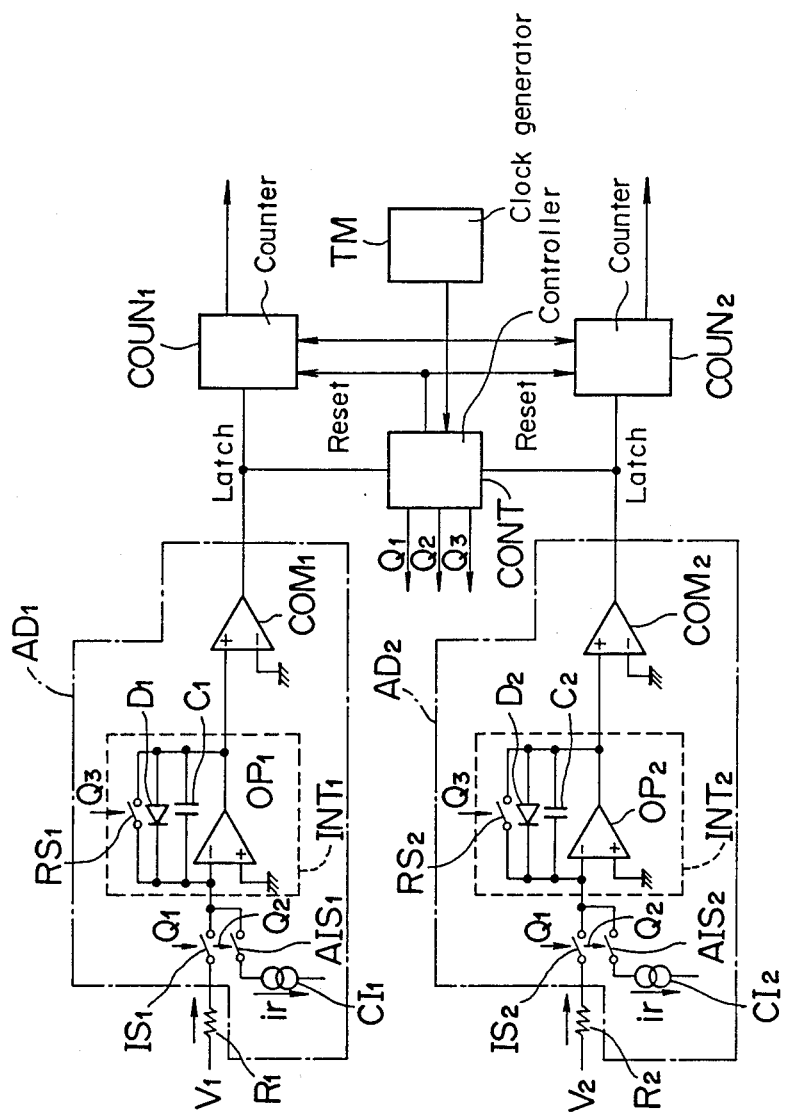
FIG. 6 is a circuit diagram of an analog to digital converting device showing a first embodiment of the present invention.
Figure 7:
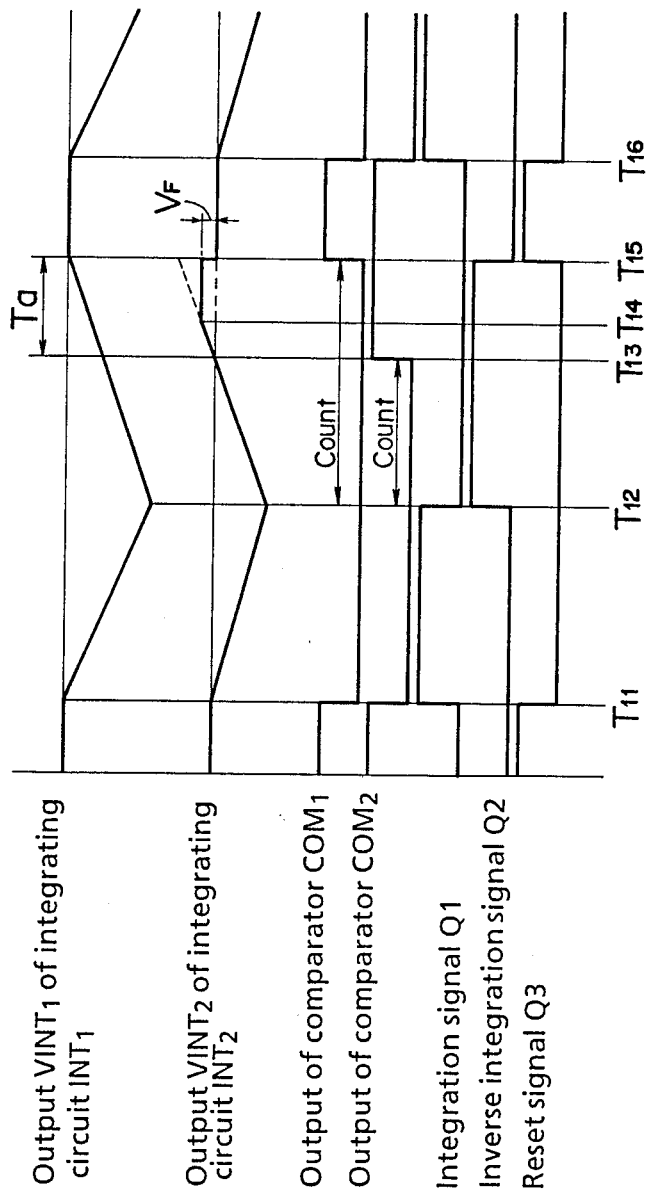
FIG. 7 is a time chart illustrating operation of the analog to digital converting device of FIG. 6 when there is a difference between two input signals.

The arrangement of FIG. 6 is different in construction from the conventional arrangement of FIG. 1 as follows:

In particular, a pair of diodes D$_1$, D$_2$ each serving as "a switching element for limiting the amount of charge accumulated during an inverse integrating operation to below a predetermined level" are connected in parallel to integrating capacitors $C_1$, $C_2$ of a pair of integrating circuits $INT_1$, $INT_2$, respectively. The anodes of the diodes $D_1$, $D_2$ are connected to outputs of a pair of operational amplifiers $OP_1$, $OP_2$ while the cathodes are connected to inverting input terminals (-) of the operational amplifiers $OP_1$, $OP_2$, respectively.

Figure 1:
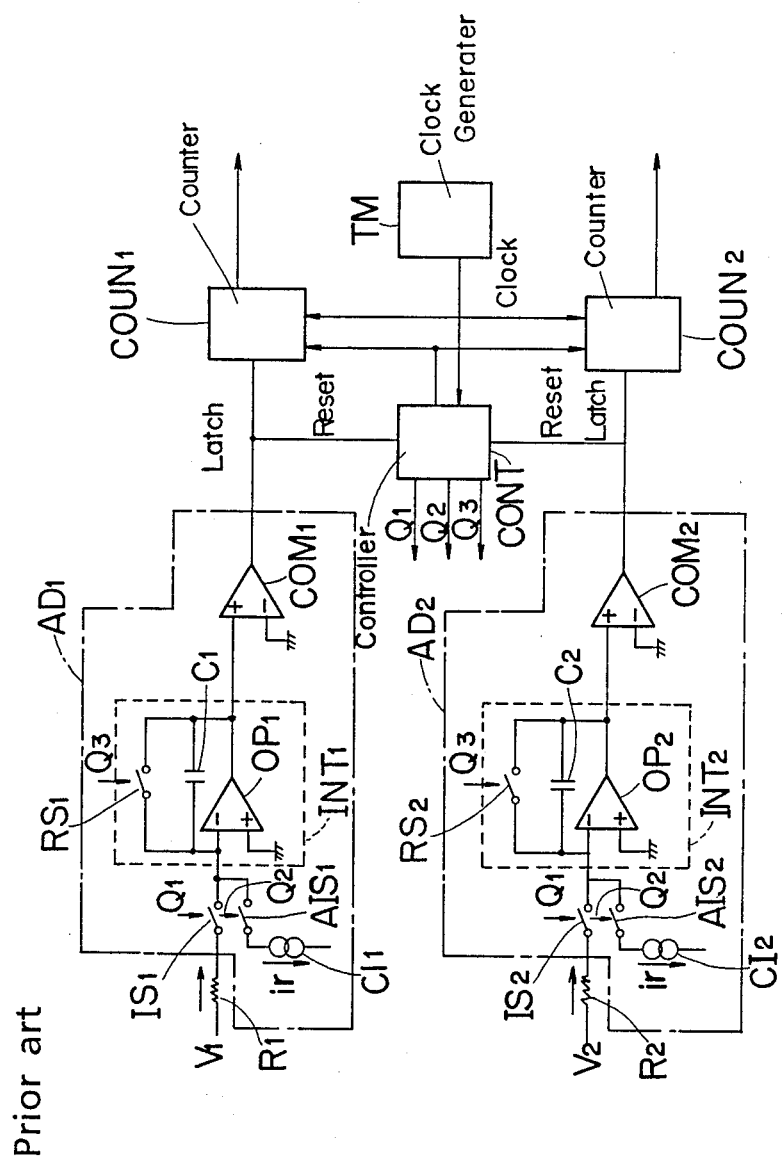
FIG. 1 is a circuit diagram showing an exemplary conventional analog to digital converting device.

Construction of the remaining portion of the arrangement of FIG. 6 is similar to that of the conventional arrangement of FIG. 1 as described above, and hence description thereof is omitted herein to avoid redundancy.

Now, operation of the analog to digital converting device shown in FIG. 6 when there is a difference between input signals $V_1$, $V_2$ to a pair of double integration analog to digital converters $AD_1$, $AD_2$ will be described with reference to the flow chart of FIG. 7.

It is assumed here that the input signal $V_2$ is smaller than the input signal $V_1$. Wave forms of an output $V_{INT1}$ of the integrating circuit $INT_1$, outputs of comparators $COM_1$, $COM_2$, an integration signal $Q_1$, an inverse integration signal $Q_2$ and a reset signal $Q_3$ are similar to those of FIG. 3 in the conventional arrangement, and only the wave form of an output $V_{INT2}$ of the integrating circuit $INT_2$ is different from that of FIG. 3.

Figure 3:
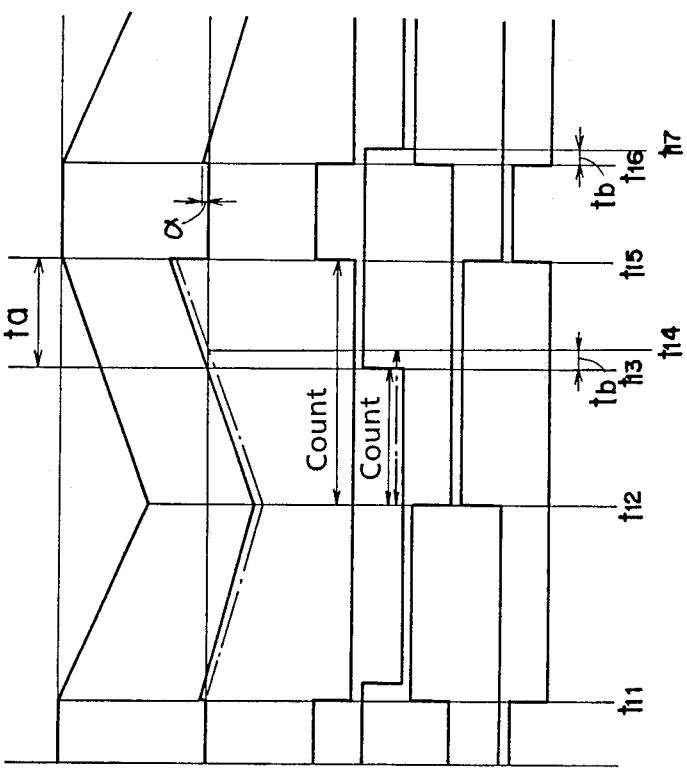
FIG. 3 is another time chart illustrating operation of the device of FIG. 1 when two input signals are different from each other.

In particular, operation of the analog to digital converting device from a time $T_{11}$ to $T_{13}$ is substantially the same as that of the conventional analog to digital converting device shown in FIG. 3 except that the outputs $V_{INT1}$, $V_{INT2}$ of the integrating circuits $INT_1$, $INT_2$ are both 0 volts at a time $T_{11}$ when the reset signal $Q_3$ is canceled and the integration signal $Q_1$ is delivered.

After the time $T_{13}$ at which the output of the comparator $COM_2$ is changed to an "H" level during an inverse integrating operation to stop counting of a counter $COUN_2$, operation of the analog to digital converting device of FIG. 6 is different from that of the conventional analog to digital converting device of FIG. 1.

In particular, also during a period of time Ta from the time $T_{13}$ to another time $T_{15}$ at which analog to digital conversion is completed on both of the double integration analog to digital converters $AD_1$, $AD_2$ and a reset signal $Q_3$ is delivered, charging of an integrating capacitor $C_2$ in the positive polarity is continued with constant current $i_r$ via a constant-current circuit $CI_2$. Where the diode $D_2$ is otherwise omitted, the charged voltage of the integrating capacitor $C_2$ will increase till the time $T_{15}$ as indicated by a broken line.

However, in the case of the analog to digital converting device of FIG. 6, further charging of the integrating capacitor $C_2$ is stopped at a time $T_{14}$ at which the charged voltage of the integrating capacitor $C_2$ becomes equal to the voltage $V_F$ of the double $D_2$ in the forward direction. Consequently, the output $V_{INT2}$ of the integrating circuit $INT_2$ will thereafter be held to the same level with the forward voltage $V_F$ of the diode $D_2$. Accordingly, the amount of charge accumulated in the integrating capacitor $C_2$ can be reduced significantly comparing with that of the conventional analog to digital converting device of FIG. 1.

Accordingly, at a time $T_{16}$ at which the reset signal $Q_3$ is canceled, little dielectric absorption will appear in the integrating capacitor $C_2$, and the amount of accumulated charge is substantially zero. As a result, at the time $T_{16}$ when the reset signal $Q_3$ is canceled, the outputs $V_{INT1}$, $V_{INT2}$ of the integrating circuits $INT_1$, $INT_2$ are both 0 volts, and the output of the comparator $COM_2$ and the output of the comparator $COM_1$ are simultaneously changed over from the "H" to the "L" level. The situations are similar at a time $T_{11}$.

Accordingly, the count value of the counter $COUN_1$ during a period of time from $T_{12}$ to $T_{15}$ of the comparator $COM_1$ corresponds to the input signal $V_1$, and the count value of the counter $COUN_2$ during another period of time from $T_{12}$ to $T_{13}$ of the comparator $COM_2$ corresponds to the input signal $V_2$. This always applies to whichever of the input signals $V_1$, $V_2$ is greater or smaller.

Figure 4:
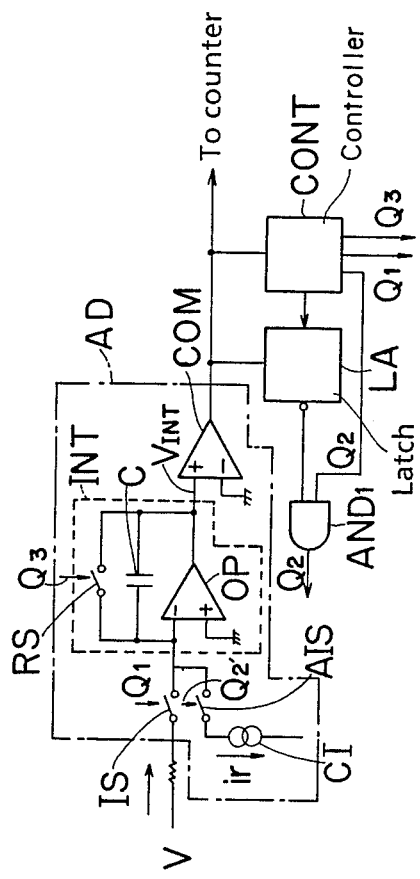
FIG. 4 is a circuit diagram showing another conventional analog to digital converting device.
Figure 5:
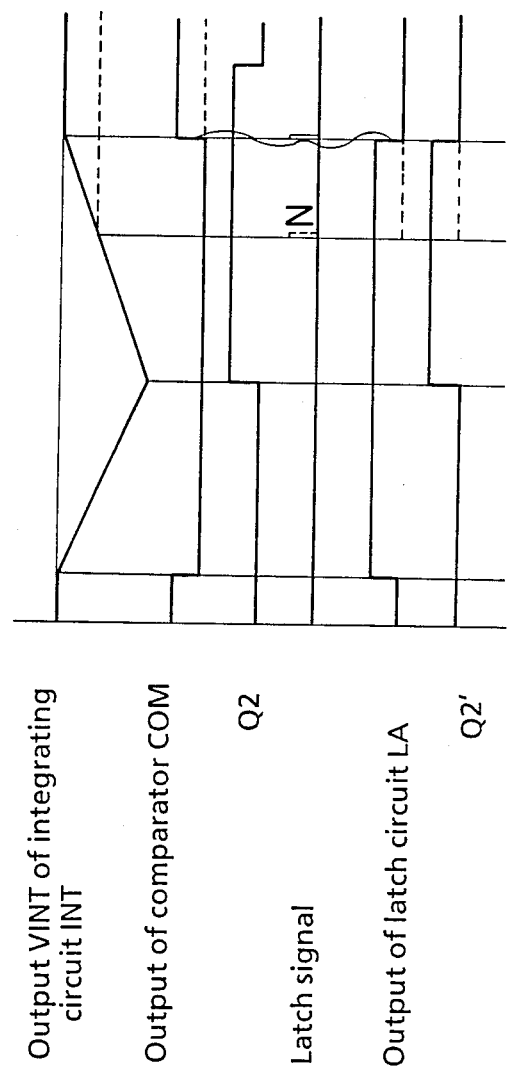
FIG. 5 is a time chart illustrating operation of the device of FIG. 4.

In other words, analog to digital conversion of the input signals $V_1$, $V_2$ can be effected with high accuracy irrespective of the input signals $V_1$, $V_2$. Besides, there is another advantage that the analog to digital converting device of FIG. 6 does not readily undergo noise interference such as appearing in the conventional analog to digital converting device shown in FIG. 4.

Figure 2:
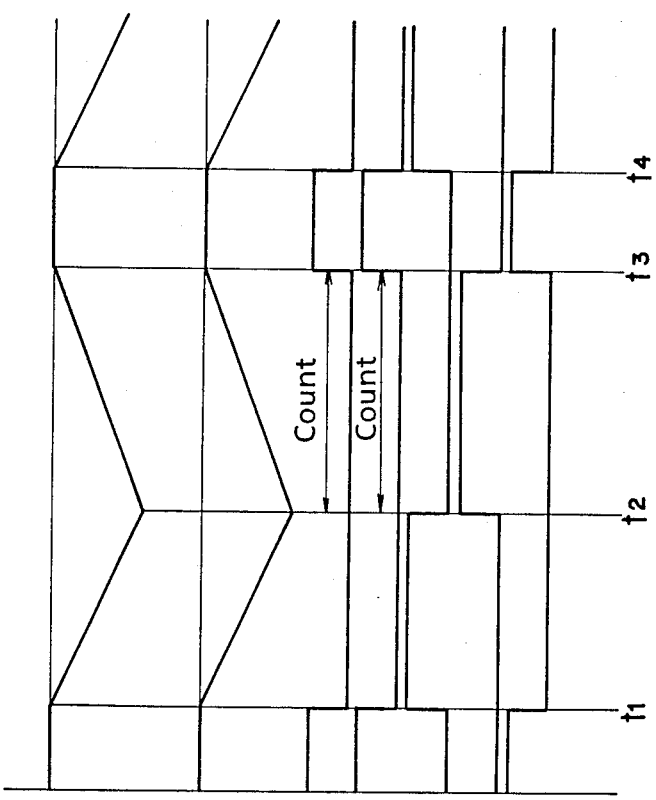
FIG. 2 is a time chart illustrating operation of the device of FIG. 1 when two input signals are equal to each other.

It is to be noted that operation of the analog to digital converting device of FIG. 6 when the input signals $V_1$, $V_2$ are equal to each other is the same as that illustrated in FIG. 2 in the case of the conventional analog to digital converting device of FIG. 1.

Figure 8:
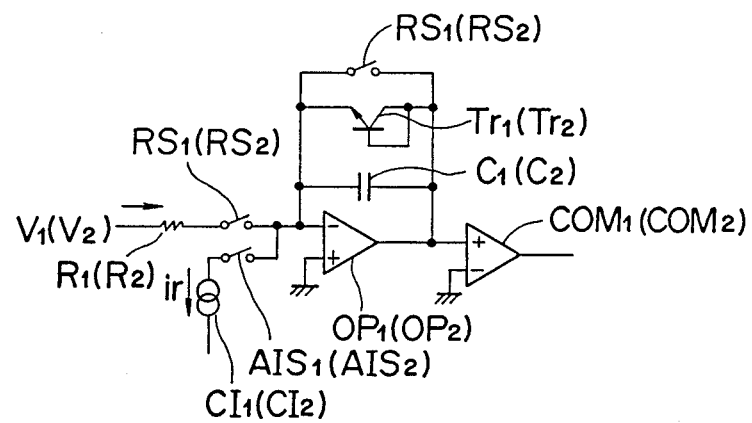
FIG. 8 is a circuit diagram of an analog to digital converter showing a second embodiment of the invention.

FIG. 8 shows an analog to digital converter for an analog to digital converting device according to a second embodiment of the invention. In the analog to digital converter shown, transistors $Tr_1$, $Tr_2$ of the NPN type each with the collector and the base thereof short-circuited are connected in parallel to integrating capacitors $C_1$, $C_2$ in place of the diodes $D_1$, $D_2$ of the device of FIG. 6, respectively. An analog to digital converting device may include a plurality of such analog to digital converters as in the first embodiment shown in FIG. 6.

Figure 9:
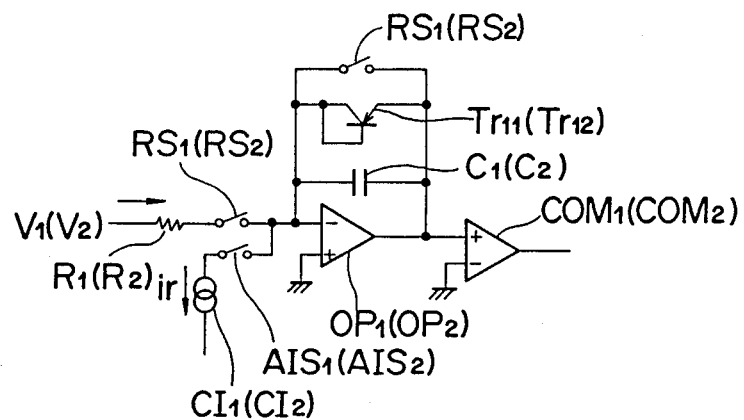
FIG. 9 is a circuit diagram of another analog to digital converter showing a third embodiment of the invention.

FIG. 9 shows another analog to digital converter for an analog to digital converting device according to a third embodiment of the invention. In the analog to digital converter shown, transistors $Tr_{11}$, $Tr_{12}$ of the PNP type each with the collector and the base thereof short-circuited are connected in parallel to integrating capacitors $C_1$, $C_2$ in place of the diodes $D_1$, $D_2$ of the device of FIG. 6, respectively. An analog to digital converting device may include a plurality of such analog to digital converters as in the first embodiment shown in FIG. 6.

Construction of the remaining part and operation of the analog to digital converting devices of FIGS. 8 and 9 are similar to those of the analog to digital converting device of FIG. 6, and accordingly description thereof will be omitted herein.

Figure 10:
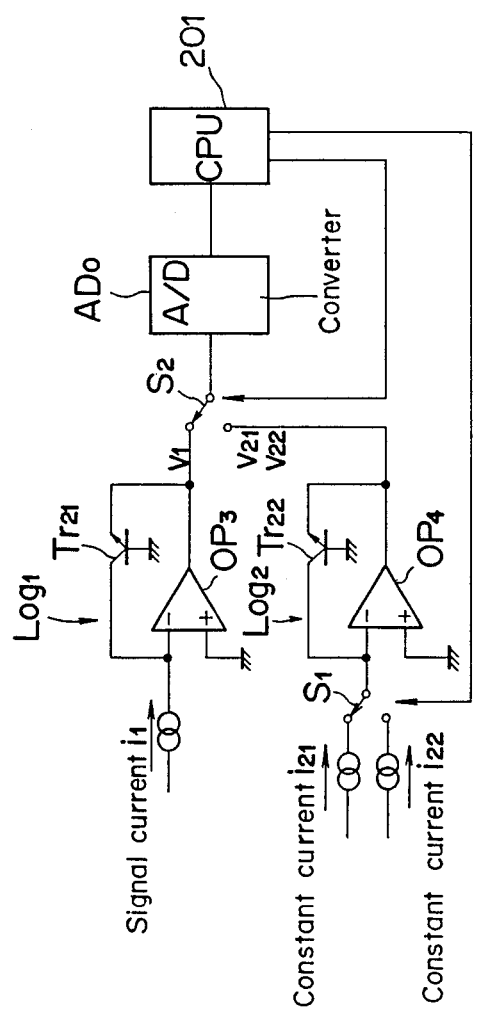
FIG. 10 is a circuit diagram of a logarithmic compressing circuit adapted to be connected to an output terminal of an analog to digital converting device according to the invention.

FIG. 10 illustrates a logarithmic compressing circuit adapted to be connected to an input terminal of such an analog to digital converter $AD_0$ (double integration analog to digital converter $AD_1$, $AD_2$) as shown in FIG. 6, 8 or 9 of an analog to digital converting device.

Referring to FIG. 10, the logarithmic compressing circuit shown includes a first logarithmic compressing circuit $Log_1$ including a transistor $Tr_{21}$ and an operational amplifier $OP_3$, a second logarithmic compressing circuit $Log_2$ including a transistor $Tr_{22}$ and an operational amplifier $OP_4$, and a switch $S_2$ for selectively connecting the first or second logarithmic compressing circuit $Log_1$ or $Log_2$ to an analog to digital converting circuit $AD_0$. The first logarithmic compressing circuit $Log_1$ is connected to receive signal current $i_1$ which is to be logarithmically compressed and converted from an analog to digital value while the second logarithmic compressing circuit $Log_2$ is connected to selectively receive one of two different constant-current flows $i_{21}$, $i_{22}$ in accordance with a position of a switch $S_1$. One of the output signals of the first and second logarithmic compressing circuits Log$_1$, Log$_2$ which is to be received by the analog to digital converting circuit AD$_0$ is selected by the switch S$_2$. Switching of the switches S$_1$, S$_2$ is controlled by a CPU 201 which is connected to receive an output signal of the analog to digital converting circuit AD$_0$.

In the first logarithmic compressing circuit Log$_1$, as the signal current i$_1$ is introduced to the transistor Tr$_{21}$ by operation of the operational amplifier OP$_3$, a voltage drop having a logarithmic characteristic with respect to the signal current i$_1$ appears between the base and the emitter of the transistor Tr$_{21}$. Since the base of the transistor Tr$_{21}$ is grounded, a voltage corresponding to the voltage drop appears at the output terminal of the first logarithmic compressing circuit Log$_1$. Accordingly, the signal current i$_1$ is converted into a voltage of a corresponding logarithmically compressed value.

Accordingly, if the output voltage of the first logarithmic compressing circuit Log$_1$ is represented by v$_1$, the output voltage of the second logarithmic compressing circuit Log$_2$ when the constant-current flow i$_{21}$ is received is represented by v$_{21}$, and the output voltage of the second logarithmic compressing circuit Log$_2$ when the constant-current flow i$_{22}$ is received is represented by v$_{22}$, the voltages v$_1$, v$_{21}$ and v$_{22}$ are given by following equations:

$$v_1 = -\frac{k \cdot Ta}{q} \cdot \ln\left(\frac{i_1}{i_{01}} + 1\right) \tag{1}$$

$$v_{21} = -\frac{k \cdot Ta'}{q} \cdot \ln\left(\frac{i_{21}}{i_{02}} + 1\right) \tag{2}$$

$$v_{22} = -\frac{k \cdot Ta'}{q} \cdot \ln\left(\frac{i_{22}}{i_{02}} + 1\right) \tag{3}$$

It is to be noted here that k is the Boltzman's constant, Ta, Ta' are ambient temperatures of the first and second logarithmic compressing circuits Log$_1$, Log$_2$, respectively, q is an amount of charge of an electron, and i$_{01}$, i$_{02}$ are reverse saturation current flows of the first and second logarithmic compressing circuits Log$_1$, Log$_2$, respectively.

The output voltages v$_1$, v$_{21}$, v$_{22}$ to be taken into the CPU 201 are converted from analog values into digital values N$_1$, N$_{21}$, N$_{22}$ which are given by following equations:

$$N_1 = n\frac{k \cdot Ta}{q} \cdot \ln\left(\frac{i_1}{i_{01}} + 1\right) \tag{4}$$

$$N_{21} = n\frac{k \cdot Ta'}{q} \cdot \ln\left(\frac{i_{21}}{i_{02}} + 1\right) \tag{5}$$

$$N_{22} = n\frac{k \cdot Ta'}{q} \cdot \ln\left(\frac{i_{22}}{i_{02}} + 1\right) \tag{6}$$

where n is a coefficient for analog to digital conversion.

Then, the CPU 201 executes operation of a following equation:

$$Nx = \frac{N_1 - N_{21}}{N_{22} - N_{21}} \tag{7}$$

Substituting the equations (4) to (6) here into the equation (7), an equation $$Nx = \tag{8}$$

$$\frac{n\frac{k \cdot Ta}{q} \cdot \ln\left(\frac{i_1}{i_{01}} + 1\right) - n\frac{k \cdot Ta'}{q} \cdot \ln\left(\frac{i_{21}}{i_{02}} + 1\right)}{n\frac{k \cdot Ta'}{q} \cdot \ln\left(\frac{i_{22}}{i_{02}} + 1\right) - n\frac{k \cdot Ta'}{q} \cdot \ln\left(\frac{i_{21}}{i_{02}} + 1\right)}$$

is obtained, and because i$_1$, i$_{21}$, i$_{22}$ are extremely large relative to i$_{01}$, i$_{02}$, the equation (8) can be rewritten as $$Nx = \frac{n\frac{k \cdot Ta}{q} \cdot \ln\left(\frac{i_1}{i_{01}}\right) - n\frac{k \cdot Ta'}{q} \cdot \ln\left(\frac{i_{21}}{i_{02}}\right)}{n\frac{k \cdot Ta'}{q} \cdot \ln\left(\frac{i_{22}}{i_{02}}\right) - n\frac{k \cdot Ta'}{q} \cdot \ln\left(\frac{i_{21}}{i_{02}}\right)} \tag{9}$$

Where the transistors Tr$_{21}$, Tr$_{22}$ are twin transistors, they have very similar characteristics to each other, and accordingly, $$i_{01} = i_{02}$$

$$Ta = Ta'$$

Substituting these equations into the equation (9), an equation $$Nx = \frac{n\frac{k \cdot Ta}{q} \cdot \ln\left(\frac{i_1}{i_{01}} \cdot \frac{i_{02}}{i_{21}}\right)}{n\frac{k \cdot Ta}{q} \cdot \ln\left(\frac{i_{22}}{i_{21}}\right)}$$

$$= \frac{\ln\left(\frac{i_1}{i_{21}}\right)}{\ln\left(\frac{i_{22}}{i_{21}}\right)} \tag{10}$$

is obtained. Here, it is assumed that i$_{22}$ is set to a predetermined multiple of i$_{21}$. In particular, if an equation $$i_{22} = C_{CONT} i_{21}$$

stands where C$_{CONT}$ is a constant, the equation (10) is rewritten as $$Nx = \frac{\ln\left(\frac{i_1}{i_{21}}\right)}{\ln(C_{CONT})}$$

$$= C_{CONT}' \cdot \ln\left(\frac{i_1}{i_{21}}\right) \tag{11}$$

where C$_{CONT}'$ = ln(C$_{CONT}$).

As apparently seen from the equation (11), Nx provides information which does not exhibit any change with respect to the ambient temperature Ta.

Accordingly, by causing the CPU 201 to perform operation of the equation (11), the temperature dependency of the logarithmic compressing circuit can be compensated for.

According to an analog to digital converting device of the present invention, the following effects can be exhibited.

Even if it is attempted to continue an inverse integrating operation after completion of analog to digital conversion in a double integration analog to digital converter when an input signal of a lower one of a plurality of levels was received, the amount of charge to be accumulated in the integrating capacitor can be limited below a predetermined level by operation of the switching element. Accordingly, the integrating capacitor can be discharged completely when the analog to digital converting device is to be reset.

Accordingly, no error will appear in analog to digital conversion, and hence the analog to digital conversion can be effected with high accuracy.

Having now fully described the invention, it will be apparent to one of ordinary skill in the art that many changes and modifications can be made thereto without departing from the spirit and scope of the invention as set forth herein.

What is claimed is:

1. An analog to digital converting device, comprising:
    first integrating means including a first operational amplifier connected to receive a first analog signal which is to be converted into a digital signal, a first integrating capacitor connected between an input terminal and an output terminal of said first operational amplifier, and a first reset switch connected in parallel to said first integrating capacitor;
    a second integrating means including a second operational amplifier connected to receive a second analog signal which is to be converted into a second digital signal, a second integrating capacitor connected between an input terminal and an output terminal of said second operational amplifier, and a second reset switch connected in parallel to said second integrating capacitor;
    a first comparator connected to an output terminal of said first integrating means;
    a second comparator connected to an output terminal of said second integrating means;
    integration starting means for starting an integrating operation of said first and said second integrating means, said integration starting means including a first integrating switch having an enabling state and a disabling state for controlling the input of said first analog signal to said first integrating means and a second integrating switch having an enabling state and a disabling state for controlling the input of said second analog signal to said second integrating means, said first and said second integrating switches being enabled at the same time to start the integrating operation of said first and said second integrating means;
    inverse integration starting means for starting an inverse integrating operation of said first and said second integrating means, said inverse integration starting means including a first inverse integrating switch having an enabling state and a disabling state for controlling an output from said first integrating means and a second inverse integrating switch having an enabling state and a disabling state for controlling an output from said second integrating means, said first and said second inverse integrating switches being enabled at the same time to start the inverse integrating operation of said first and said second integrating means;
    controlling means for activating said first and said second reset switches of the respective first and second integrating means, said integration starting means and said inverse integration starting means in this order with said controlling means placing said first and said second integrating switches in the disabling state at the same time as placing said first and said second inverse integrating switches in the enabling state;
    first limiting means connected in parallel to said first integrating capacitor for limiting an amount of charge to be accumulated in said first integrating capacitor by an inverse integrating operation to below a predetermined level; and
    second limiting means connected in parallel to said second integrating capacitor for limiting an amount of charge to be accumulated in said second integrating capacitor by an inverse integrating operation to below a predetermined level.

2. An analog to digital converting device according to claim 1, wherein said first limiting means includes a diode connected in parallel to said first integrating capacitor and said second limiting means includes a diode connected in parallel to said second integrating capacitor.

3. An analog to digital converting device according to claim 1, wherein said first limiting means includes a transistor connected in parallel to said first integrating capacitor between the collector and the emitter thereof and short-circuited between the base and the collector thereof and said second limiting means includes a transistor connected in parallel to said second integrating capacitor between the collector and the emitter thereof and short-circuited between the base and the collector thereof.

4. An analog to digital converting device according to claim 1, wherein said first comparator includes means for producing a predetermined signal when an output level at said output terminal of said first integrating means reaches a predetermined value and said second comparator includes means for producing a predetermined signal when an output level at said output terminal of said second integrating means reaches a predetermined value.

5. An analog to digital converting device according to claim 4, further comprising counting means for counting a time until the predetermined signal is produced by the first comparator means for producing a predetermined signal after starting of the inverse integrating operation of said first integrating means and counting a time until the predetermined signal is produced by the second comparator means for producing a predetermined signal after starting of the inverse integrating operation of said second integrating means.

6. An analog to digital converting device, comprising:
    a plurality of integrating means, each said integrating means including an operational amplifier connected to receive an analog signal which is to be converted into a digital signal, an integrating capacitor connected between an input terminal and an output terminal of said operational amplifier, and a reset switch connected in parallel to said integrating capacitor;

a plurality of comparators, each said comparator being connected to an output terminal of a respective one of said integrating means;

integration starting means for starting an integrating operation of a plurality of said integrating means, said integration starting means including a plurality of integrating switches, each said integrating switch having an enabling state and a disabling state for controlling the input of an analog signal to a respective one of said integrating means, said integrating switches being enabled at the same time to start the integrating operation of a plurality of said integrating means;

inverse integration starting means for starting an inverse integrating operation of a plurality of said integrating means, said inverse integration starting means including a plurality of inverse integrating switches, each said inverse integrating switch having an enabling state and a disabling state for controlling an output from a respective one of said integrating means, said inverse integrating switches being enabled at the same time to start the inverse integrating operation of a plurality of said integrating means;

controlling means for activating said reset switches of a plurality of said integrating means, said integration starting means and said inverse integration starting means in this order with said controlling means placing said enabled integrating switches in the disabling state at the same time as placing said inverse integrating switches in the enabling state; and a plurality of limiting means, each said limiting means being connected in parallel to a respective one of said integrating capacitors for limiting an amount of charge to be accumulated in the respective integrating capacitor by an inverse integrating operation to below a predetermined level.

* * * * *